US006686763B1

United States Patent
Yen

(10) Patent No.: US 6,686,763 B1
(45) Date of Patent: Feb. 3, 2004

(54) NEAR-ZERO PROPAGATION-DELAY ACTIVE-TERMINATOR USING TRANSMISSION GATE

(75) Inventor: Yao Tung Yen, Cupertino, CA (US)

(73) Assignee: Pericam Semiconductor Corp., San Jose, CA (US)

( * ) Notice: Subject to any disclaimer, the term of this patent is extended or adjusted under 35 U.S.C. 154(b) by 61 days.

(21) Appl. No.: 10/063,827

(22) Filed: May 16, 2002

(51) Int. Cl.[7] .................................................. H03K 19/003
(52) U.S. Cl. ........................... 326/30; 326/31; 326/26; 326/27
(58) Field of Search .................... 326/26, 27, 30–34, 326/82, 83; 327/108–112

(56) References Cited

U.S. PATENT DOCUMENTS

| 4,748,426 | A | 5/1988 | Stewart | 333/22 |
|---|---|---|---|---|
| 5,038,060 | A | 8/1991 | Francheteau et al. | 307/520 |
| 5,166,561 | A | 11/1992 | Okura | 307/549 |
| 5,227,677 | A | 7/1993 | Furman | 307/443 |
| 5,313,105 | A | 5/1994 | Samela et al. | 307/99 |
| 5,329,190 | A | 7/1994 | Igarashi et al. | 307/540 |
| 5,347,177 | A | 9/1994 | Lipp | 307/443 |
| 5,528,167 | A | 6/1996 | Samela et al. | 326/30 |
| 5,530,377 | A | 6/1996 | Walls | 326/30 |
| 5,684,410 | A | * 11/1997 | Guo | 326/27 |
| 5,726,583 | A | 3/1998 | Kaplinsky | 326/30 |
| 5,894,238 | A | * 4/1999 | Chien | 327/112 |
| 5,969,543 | A | 10/1999 | Erickson et al. | 326/83 |
| 6,072,342 | A | 6/2000 | Haider et al. | 327/112 |
| 6,184,730 | B1 | 2/2001 | Kwong et al. | 327/112 |
| 6,208,178 | B1 | 3/2001 | Chen | 327/108 |
| 6,307,395 | B1 | 10/2001 | Kalb et al. | 326/30 |
| 6,351,138 | B1 | 2/2002 | Wong | 326/30 |

* cited by examiner

*Primary Examiner*—Anh Tran
(74) *Attorney, Agent, or Firm*—Stuart T. Auvinen

(57) ABSTRACT

A transmission line is terminated by a buffer. The buffer isolates a load from the transmission line using a transmission gate. The transmission gate is turned off and does not conduct most of the time, but turns on when a transition is detected on the transmission line, allowing the transmission line to directly drive the load for a short time. Once the load is switched beyond a logic threshold voltage, the transmission gate is again turned off and a latch or latching transistors driven by the transmission line continue to drive the isolated load to power or ground voltages. Driver transistors are also enabled when the transmission gate is turned on, driving either the output (load) node or the input (transmission line) node with the new data. Feedback from the output node disables the transmission gate and driver transistors once the output has been driven past the logic threshold.

22 Claims, 7 Drawing Sheets

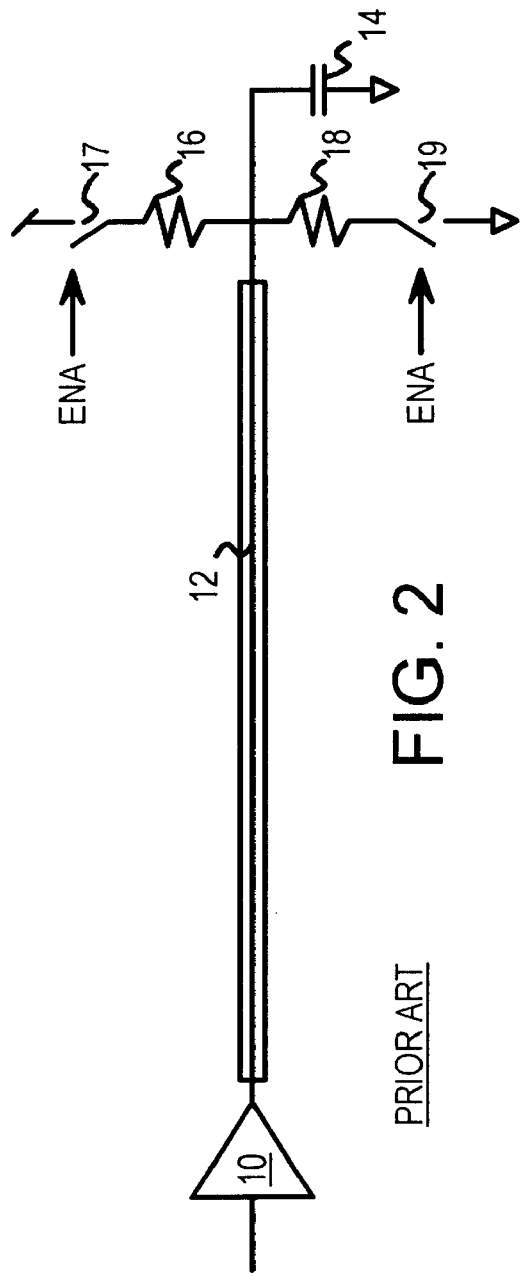
FIG. 1
PRIOR ART
FIG. 2
PRIOR ART

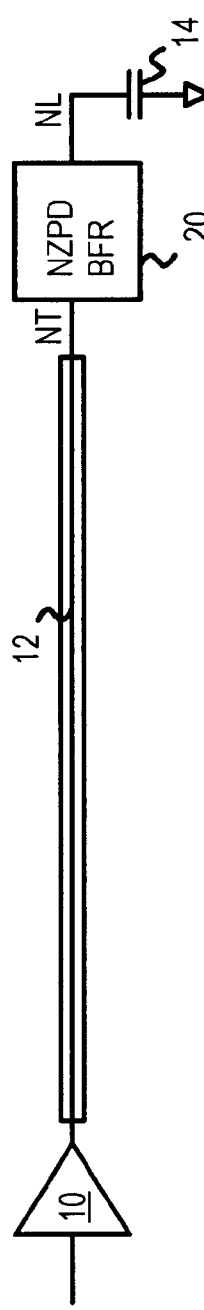
FIG. 3
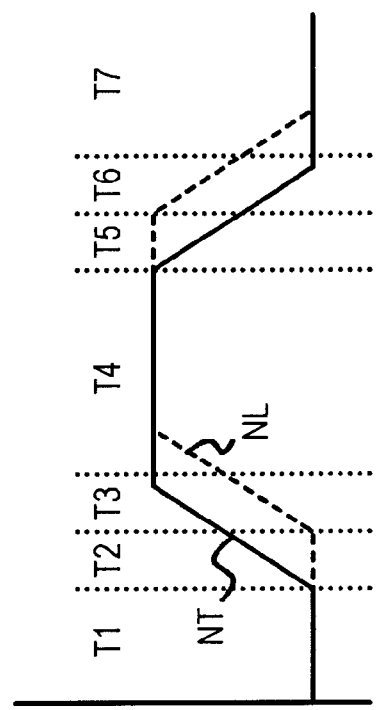
FIG. 4B
FIG. 4A

US 6,686,763 B1

NEAR-ZERO PROPAGATION-DELAY ACTIVE-TERMINATOR USING TRANSMISSION GATE

BACKGROUND OF INVENTION

This invention relates to transmission lines, and more particularly to active terminator buffers with positive feedback.

Performance of electronic systems can be improved by increasing clock rates. However, as clock rates rise above 100 MHz, metal traces on circuit boards behave as transmission lines, exhibiting reflections, undershoot, overshoot, and ringing that distort signals.

Expandability of systems also can create problems. For example, a personal computer may be shipped with a base memory having 18 memory chips driven by a clock line. The clock driver is able to drive the 18 memory chips without serious signal distortion. However, when the user later expands the memory to 36 memory chips the clock driver is unable to drive the doubled load without serious signal distortion.

FIG. 1 shows a transmission line driving a load. Driver 10 drives one end of transmission line 12, which can be a metal trace on a circuit board, or a cable or other connection to another board or component, or some other combination. Load 14 at the far end of transmission line 12 is being driven, and can represent several chip inputs such as pins on memory chips.

When driver 10 drives its output from low to high, the near end of transmission line 12 is driven high while the far end remains low. A wave front travels down transmission line 12 until it reaches load 14 at the far end, driving it high. However, the wave front can reflect off load 14 and a reflected wave travel backwards along transmission line 12 to driver 10. Further reflections can then occur.

FIG. 2 shows an active terminator for a transmission line. Termination resistors are often added to suppress reflections. For example, a series resistor can be added between the output of driver 10 and the near end of transmission line 12, and a resistor can be added between the far end of transmission line 12 and ground or some other fixed voltage.

Terminating resistors can also be actively enabled and disabled by software, hardware, or even in response to a wave front traveling down the transmission line. Terminating resistor 18 is connected to ground when switch 19 is closed in response to an enable signal, and likewise pull-up resistor 16 connects the far end of transmission line 12 to a power-supply voltage when an enable closes switch 17.

Switches 17, 19 can have the same enable signal or different enable signals, and these signal can be static or stable for long periods of time that include many high and low transitions of transmission line 12, or can be dynamic and change for each high or low-going transition. Such active terminators often act as negative feedback to suppress signal reflections.

What is desired is an active terminator for a transmission line that uses positive feedback rather than negative feedback. An active terminator that isolates the load from the transmission line for parts of a cycle is desired. A more sophisticated active terminating buffer is desired.

BRIEF DESCRIPTION OF DRAWINGS

FIG. 1 shows a transmission line driving a load.

FIG. 2 shows an active terminator for a transmission line.

FIG. 3 shows an isolating buffer used as an active terminator for a transmission line.

FIG. 4A is a waveform to highlight operation of the active-terminating NZPD buffer.

FIG. 4B highlights operation of the active-terminator buffer during each of the time periods of FIG. 4A.

DETAILED DESCRIPTION

Figure 5:
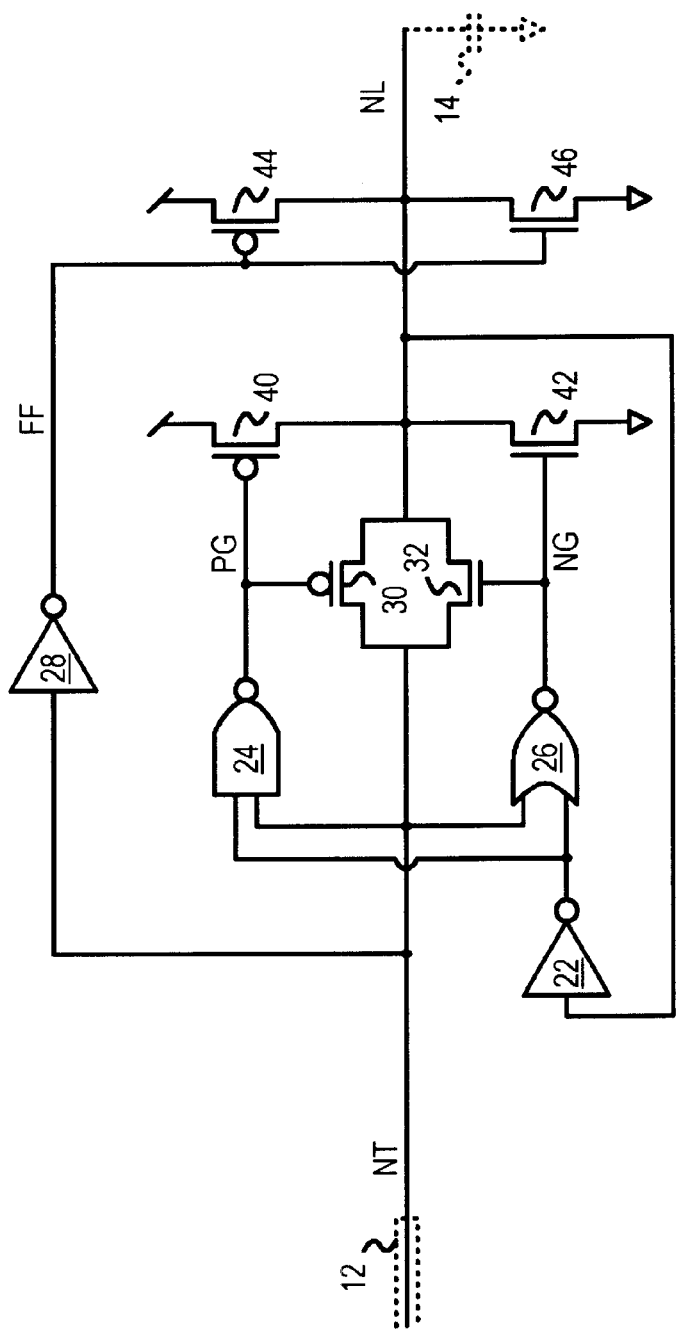
FIG. 5 is a schematic of a near-zero-propagation-delay buffer used as an active terminator of a transmission line.

The present invention relates to an improvement in active terminators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 3 shows an isolating buffer used as an active terminator for a transmission line. Load 14 is separated from the far end of transmission line 12 by buffer 20. Buffer 20 detects the wave front that travels down transmission line 12 when driver 10 drives the line high or low. When buffer 20 detects the wave front from driver 10, buffer 20 drives load 14 and connects load 14 to transmission line 12. At the end of a high or low-going transition, buffer 20 disconnects load 14 from transmission line 12 but continues to drive the load through buffer 20.

22

Buffer 20 contains a transmission gate between its input, the far end of transmission line 12 (node NT), and its output to load 14 (node NL). Buffer 20 also contains drivers that more indirectly drive load 14 but do not allow reflections from load 14 back onto transmission line 12. Using the transmission gate and drivers, buffer 20 is able to quickly drive load 14 and is thus known as a near-zero-propagation-delay (NZPD) buffer. Very little additional delay is added by buffer 20 when driving load 14.

FIG. 4A is a waveform to highlight operation of the active-terminating NZPD buffer. When driver 10 of FIG. 3 drives the near end of transmission line 12 from low to high, the rising-edge wave front travels down transmission line 12 to the far end, node NT. A rise in the voltage of node NT is seen. Then buffer 20 is activated and drives load 14 on node NL. There is a small delay between the input (node NT) and output (node NL) of buffer 20. When drive 10 drives from high to low, node NT first falls from high to low, then node NL falls.

The waveform can be divided into several time periods T1–T7. Time period T1 is before the rising edge is detected at the far end. When the far end of the transmission line (node NT) begins to rise, time period T2 starts. T2 ends and T3 begins when buffer 20 begins to drive node NL higher. Time T3 ends near the end of the transitions.

Time period T4 contains the stable output-high time until the next (falling-edge) transition begins. Then time period T5 occurs as the new falling edge is first detected, and time T6 begins as the output of buffer 20, node NL, begins to be driven low. Finally time T6 ends and T7 begins and the transmission line and output load remain in a stable low state.

The exact beginning and ending of these time periods is more precisely defined by operation of buffer 20 as is described later in detail. FIG. 4B highlights operation of the active-terminator buffer during each of the time periods of FIG. 4A. Buffer 20 contains a transmission gate (XG) that includes p-channel pass transistor 30 (P-30) and n-channel pass transistor 32 (N-32). Buffer 20 also contains a driver (DRV) that includes p-channel pull-up transistor 40 (P-40) and n-channel pull-down transistor 42 (N-42). The table in FIG. 4B shows when each of these transistors are on or off.

The transmission gate and driver transistors in buffer 20 are off for most of the time. This isolates load 14 from the transmission line for most of the time. However, during time T3, the p-channel transistors turn on. As p-channel pass transistor 30 turns on, nodes NT and NG are connected together by the transmission gate, allowing the far end of transmission line 12 to drive load 14 directly with little delay. This causes the output node NL to begin to rise as shown in FIG. 4A. Also, p-channel pull-up transistor 40 turns on, further pulling node NL higher. This occurs during time T3.

Once the output NL has been driven high above a certain logic-threshold voltage, transistors 30, 40 are shut off and time T3 ends and T4 begins. Other driver transistors in buffer 20 or a latch on node NL can continue to drive node NL to a higher level.

For the low-going transition, once the falling edge at the far end of transmission line 12 is detected during time T5, transistors 32, 42 are turned on to begin time T6. As n-channel pass transistor 32 turns on, nodes NT and NG are again connected together by the transmission gate, allowing the far end of transmission line 12 to drive load 14 directly with little delay. This causes the output node NL to begin to fall as shown in FIG. 4A. Also, n-channel pull-down transistor 42 turns on, pulling node NL lower. This occurs during time T6.

Once the output NL has been driven low below a certain logic-threshold voltage, transistors 32, 42 are shut off and time T6 ends and T7 begins. Other driver transistors in buffer 20 or a latch on node NL can continue to drive node NL to a low level. Time period T7 is the same as time T1 in the next cycle.

FIG. 5 is a schematic of a near-zero-propagation-delay buffer used as an active terminator of a transmission line. The far end of transmission line 12 is node NT, the input to buffer 20. Load 14 at output node NL is isolated from input node NT by a transmission gate that includes p-channel pass transistor 30 and n-channel pass transistor 32.

Transmission gate transistors 30, 32 are normally off, but latching transistors 44, 46 drive load 14 at all times, maintaining high and low levels on node NL. Inverter 28 has an input at input node NT and drives node FF, the gates of latching transistors 44, 46 which have drains connected to output node NL. Thus inverter 28 and latching transistors 44, 46 provide two inversions, so at steady-state node the logic level of NT is driven to node NL.

Latching transistors 44, 46 can be designed to have a weaker drive than transmission gate transistors 30, 32 and driver transistors 40, 42, but this is not necessary.

Control logic to drive the gates of transmission gate transistors 30, 32 and driver transistors 40, 42 includes inverter 22, NAND gate 24, and NOR gate 26. At steady-state when no transitions occur, node NT and NL are both in the same state, either high or low. When NL and NT are both low, (time T1) inverter 22 outputs a high to NAND gate 24 and NOR gate 26. Since the other inputs (NT) to gates 24, 26 is low, NOR gate 26 outputs a low to node NG, the gates of n-channel transistors 32, 42, turning them off. NAND gate 24 outputs a high to node PG, the gates of p-channel transistors 30, 40, turning them off. When NL and NT are both high, (time T4) inverter 22 outputs the opposite state. Thus one of the inputs to gates 24, 26 is low and the other of the inputs is high at steady-state, causing NAND gate 24 to output a high and NOR gate 26 to output a low, keeping transistors 30, 32, 40, 42 off.

When a low-to-high transition occurs on transmission line 12, node NT goes high while node NL is still low and isolated from node NT (time T2). The low on NL is fedback and inverted by inverter 22 to a high. Since NT is now high, both inputs to NAND gate 24 are high, and NAND gate 24 drives a low to the gates of transistors 30, 40. Time T3 begins and T2 ends. This turns on p-channel pass transistor 30, which allows transmission line 12 to directly drive load 14 on node NL. Also, p-channel pull-up transistor 40 turns on, pulling node NL high to the power-supply voltage Vcc. NOR gate 26 continues to drive a low to transistors 32, 42, keeping them off.

Once load 14 is charged up above the logic threshold of inverter 22, inverter 22 drives a low to NAND gate 24, which then drives a high to the gates of p-channel transistors 30, 40, turning them off. NOR gate 26 continues to drive a low, since input node NT is high. Time T3 ends and T4 begins.

For the high-to-low transition of transmission line 12, input node NT goes low while output node NL is still high at the start of time T5. Nodes NT and NL are initially isolated during times T4, T5. Inverter 22 initially drives a low to NOR gate 26, and when input node NT goes low as well, NOR gate 26 drives a high to the gates of n-channel transistors 32, 42, turning them on as time T6 begins. Nodes NL and NT are then connected together by n-channel pass transistor 32, allowing the transmission line driver to directly drive load 14. Also, n-channel pull-down transistor 42 turns on to drive output node NL low to ground. Since the NT input to NAND gate 24 is now low, NAND gate 24 continues to drive a high to transistors 30, 40, keeping them off.

Once load 14 is discharged below the logic threshold of inverter 22, inverter 22 drives a high to NOR gate 26, which then drives a low to the gates of n-channel transistors 32, 42, turning them off. Time T6 ends and T7 begins. Thus transmission gate transistors 30, 32 and driver transistors 40, 42 are on only briefly during a transition at time period T3 or T6. Load 14 is isolated from transmission line 12 for most of the time, preventing reflections from load 14 back to transmission line 12.

Since the capacitance of gates 24, 26, inverter 28, and the drains of transistors 30, 32 is usually much less than the capacitance of load 14 (many memory chip pins, for example), the loading on transmission line 12 is reduced as is the intensity of reflections. A possible second reflection from load 14 back through the transmission gate occurs at a later time than the initial reflection from buffer 20. Thus the reflections occur at different times and reduce the magnitude of signal distortions by spreading them out over time. Signal integrity is generally improved due to the lower transmission line loading, partial termination by transistors 40, 42, and due to latching transistors 44, 46 driving the load fully high or low.

The transmission line can initially be driven high and low faster since load 14 is initially disconnected. The transmission line has a higher initial slew rate due to load isolation. The slew rate of the load, output node NL, is improved by a driver transistor and by the transmission line driving through a transmission gate transistor.

Figure 6:
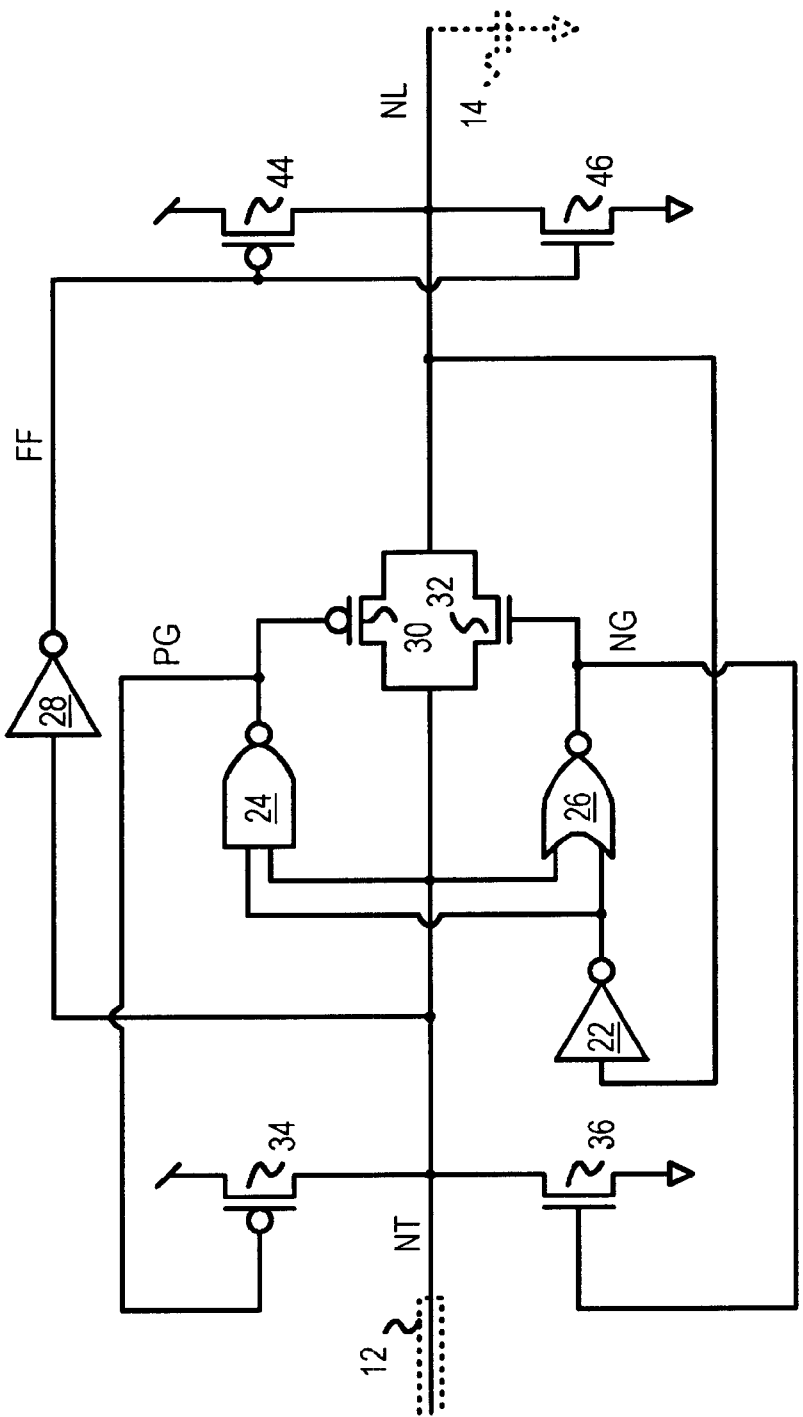
FIG. 6 shows an alternate embodiment with driver transistors on the input node rather than the output node.

FIG. 6 shows an alternate embodiment with driver transistors on the input node rather than the output node. Control logic gates 24, 26, transmission gate transistors 30, 32 and latching transistors 44, 46 of buffer 20' operate as described before for FIG. 5.

NAND gate 24 drives node PG to the gate of p-channel driver transistor 34, which has its drain connected to input node NT. NOR gate 26 drives node NG to the gate of n-channel driver transistor 36, which has its drain also connected to input node NT. Driver transistors 34, 36 operate with the same timing as described for driver transistors 40, 42 of FIG. 5, except that output node NL must be driven through transmission gate transistors 30, 32 by both transmission line 12 and driver transistors 34, 36. Since driver transistors 34, 36 are both initially off at the start of a new transition, the transmission line driver does not have to fight against the driver transistors in the old state.

Figure 7:
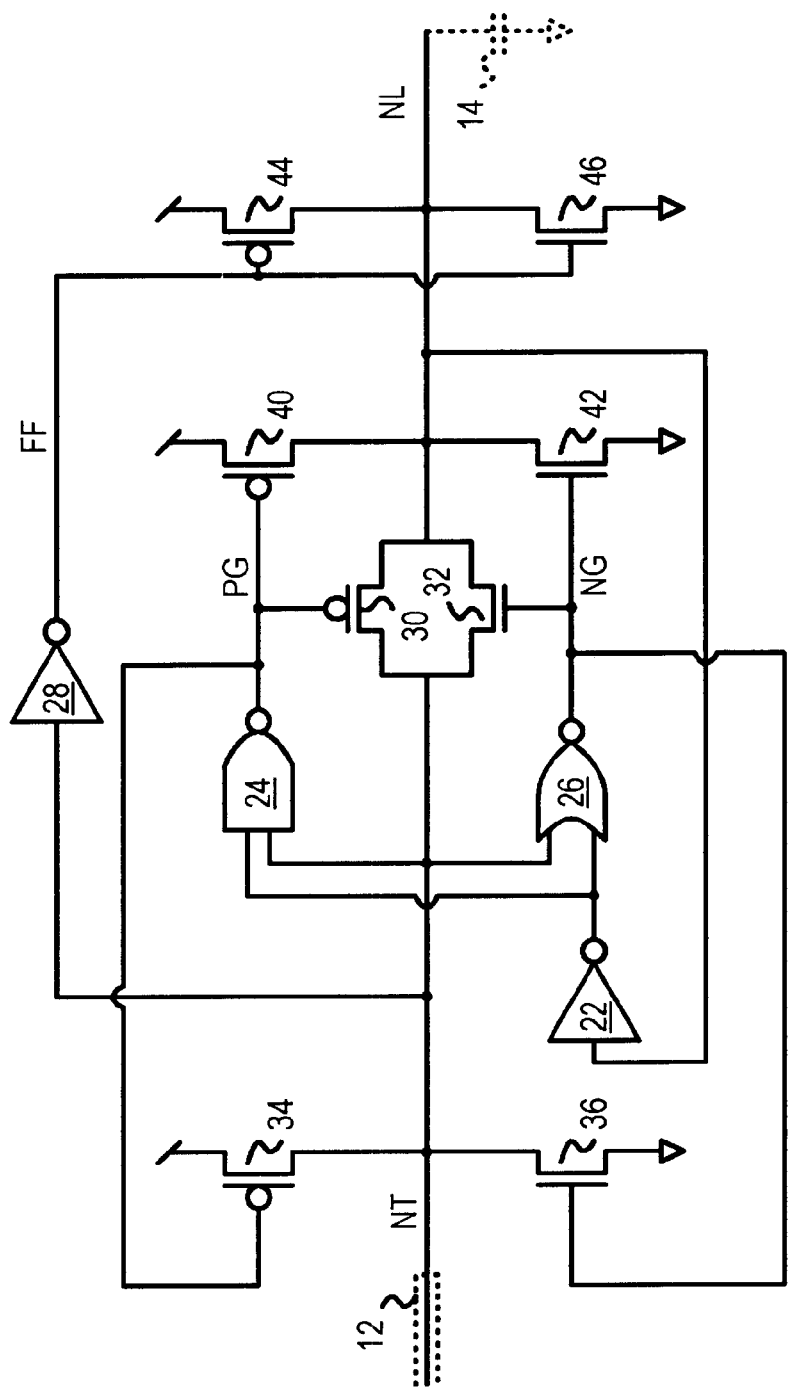
FIG. 7 shows an alternate embodiment with driver transistors on both the input and output nodes.

FIG. 7 shows an alternate embodiment with driver transistors on both the input and output nodes. Control logic gates 24, 26, transmission gate transistors 30, 32 and latching transistors 44, 46 of buffer 20' operate as described before for FIG. 5.

NAND gate 24 drives node PG to the gate of p-channel driver transistor 34, which has its drain connected to input node NT, and to the gate of p-channel pass transistor 40, which has its drain connected to output node NL. Similarly, NOR gate 26 drives node NG to the gate of n-channel driver transistor 36, which has its drain also connected to input node NT. Node NG also is connected to the gate of n-channel pass transistor 42, which has its drain connected to output node NL.

Driver transistors 34, 36 operate with the same timing as driver transistors 40, 42, as described for FIG. 5. Both the input node NT and the output node NL are driven by driver transistors in this embodiment. Output node NL is driven directly by driver transistors 40, 42, and through transmission gate transistors 30, 32 by both transmission line 12 and driver transistors 34, 36.

Figure 8:
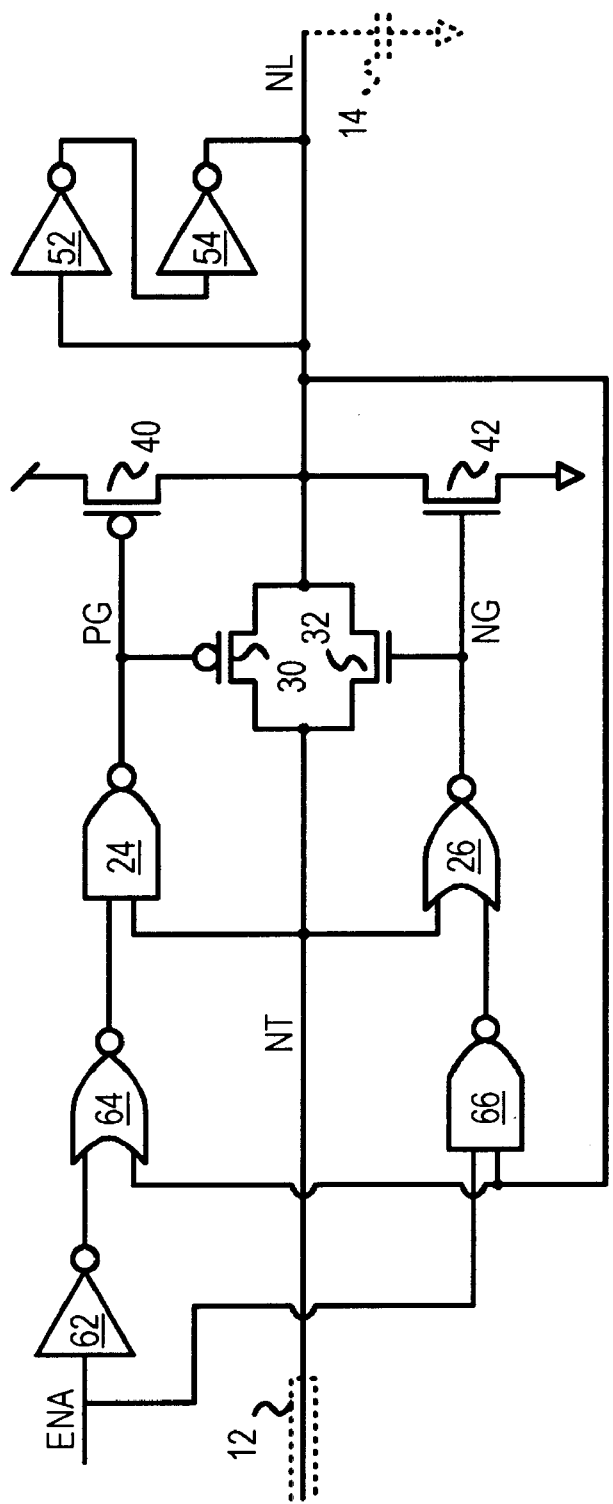
FIG. 8 is an active-terminator buffer using a latch on the output node.

FIG. 8 is an active-terminator buffer using a latch on the output node. Rather than use latching transistors 44, 46, a latch can be placed on output node NL. Inverters 52, 54 are coupled to output node NL and act as a transparent latch or bi-stable element to maintain the last state of output node NL.

The latch restores the output voltage to full power and ground levels. However, when a latch is used on the output rather than latching transistors driven from the input node, the drive through the transmission gate and from driver transistors must be sufficient to over-power the current from the latch so that the latch can be tripped. Then when a new transition occurs at node NT, driver transistors 40, 42 and transmission gate transistors 30, 32 are able to drive output node NL to the new state, overcoming latch current from inverter 54.

Enable signal ENA is input to buffer 60. ENA can be used to disable operation of buffer 60 regardless of the state of transmission line 12. Inverter 62 inverts enable and drives an input of enable NOR gate 64, while enable directly drives an input of enable NAND gate 66. When enable ENA is low, the output of enable NAND gate 66 is forced high, which is input to NOR gate 26, forcing node NG low. This keeps n-channel transistors 32, 42 off regardless of data on node NT. Also When enable ENA is low, the output of enable NOR gate 64 is forced low, which is input to NAND gate 24, forcing node PG high. This keeps p-channel transistors 30, 40 off regardless of data on node NT.

When enable ENA is high, enable NOR gate 64 and enable NAND gate 66 each invert output node NL. Gates 64, 66 perform the inverting function of inverter 22 of FIG. 5 when enable ENA is high (active). Otherwise, gates 24, 26, transmission gate transistors 30, 32 and driver transistors 40, 42 of buffer 60 operate as described before for FIG. 5.

Figure 9:
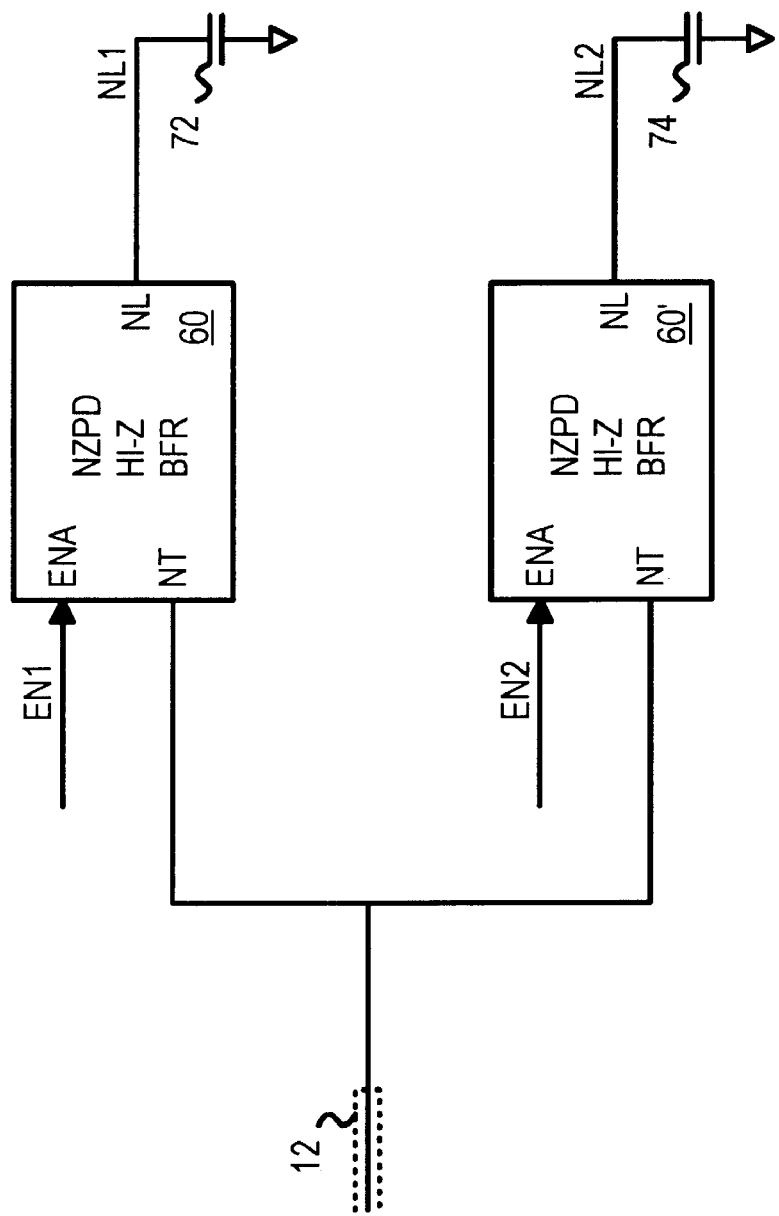
FIG. 9 shows the active-terminator buffer being used as a multiplexer.

FIG. 9 shows the active-terminator buffer being used as a multiplexer. The load at the far end of transmission line 12 is divided into sub-loads 72, 74. For example, half of the memory chips, expansion sockets, or other devices could be connected to output node NL1, while the other half of the memory chips, expansion sockets, or other devices are connected to output node NL2.

The far end of transmission line 12, input node NT, is connected to the inputs of two buffers 60, 60'. First buffer 60 has its enable input connected to first enable EN1, and drives first sub-load 72 on node NL1 when EN1 is active. Second buffer 60' has its enable input connected to second enable EN2, and drives second sub-load 74 on node NL2 when EN2 is active. Identical buffers 60, 60' can be used with different enable inputs.

Enables EN1, EN2 can be inverses of each other, or can be separately generated. Both EN1 and EN2 could be on when both sub-loads 72, 74 are to be simultaneously driven, or only one enable could be on at any time. Other buffers 60 could be added with other sub-loads, allowing the overall load on transmission line 12 to be divided into smaller parts that can be driven more quickly. The latches on output nodes NL1, NL2 can hold the previous data when the enable is driven inactive.

ALTERNATE EMBODIMENTS

Several other embodiments are contemplated by the inventor. For example the buffer can be used as a bi-directional transceiver for bi-directional data transfer. Another buffer, connected in the reverse direction, can be used for read operation. Read/Write command/status signals can be input as enable signals to the buffers to control the direction of data flow.

Additional termination could be added, such as a series resistor at the near end of the transmission line, or a resistor to ground or another fixed voltage at the input or output to buffer 20. A clocked latch could be substituted, using enable signal ENA to open the input to the latch, or using some other signal such as a transition detector on input node NT. Many kinds of latches, cross-coupled devices, etc. could be substituted. Inverters 52, 54 of FIG. 8 could replace latching transistors 44, 46 in the embodiments of FIGS. 5–7 without using the enable circuit of FIG. 8. Rather than use latches, logic can drive output nodes of disabled buffers high or low to a known state.

Logic can be re-arranged using DeMorgan's theorem, and inversions and buffers can be added at different places in the circuits. Passive components such as resistors and capacitors can be added, as can leaker transistors that act somewhat as resistors. More complex enable and control logic may be used, and signals can be gated or clocked and timings adjusted. NMOS pull-up transistors may be substituted for the p-channel pull-ups using inverse gate signals.

Both the p-channel and n-channel transmission gate transistors could be enabled at the same time by modifying the control logic. A single transmission gate pass transistor could be substituted that is enabled for both high-going and low-going transitions. An exclusive-OR (XOR) gate could enable the pass transistor by XOR'ing the input and output nodes. The terms source and drain can be interchangeable as voltage bias conditions change, such as for transmission gate transistors.

The logic switching thresholds can be adjusted by careful circuit design and hysteresis can be added by substituting appropriate logic gates and adjusting transistor size ratios. Logic thresholds other than Vcc/2 can be obtained by such ratio adjustments or more complex gates with internal feedback transistors.

The transmission line can be a trace or traces on one or more circuit boards, cables, connectors, etc., and may include internal metal lines on an integrated circuit or hybrid package, especially as higher clock or data rates are used and transmission line effects occur inside integrated circuit chips.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An active terminating buffer for a transmission line comprising:

an input node from a far end of a transmission line that receives a signal sent from a driver at another end of the transmission line;

an output node coupled to a load to be driven by the transmission line;

a pass transistor coupled to conduct current between the input and output nodes when the pass transistor is enabled by a gate signal, but for isolating the output node from the input node when the pass transistor is disabled by the gate signal;

control logic, receiving the output node and the input node as inputs, for activating the gate signal to enable the pass transistor to connect the transmission line to the load when the input node is in an opposite logical state from the output node, but for de-activating the gate signal to disable the pass transistor and isolate the load from the transmission line when the output node is in a same logical state as the input node;

latch means, on the output node, for continuing to drive the output node when the gate signal disables the pass transistor to isolate the load from the transmission line; and drive means, responsive to the gate signal and activated when the pass transistor is enabled, but de-activated when the pass transistor isolates the load from the transmission line, for driving the load to a same logical state as a logical state of the input node, whereby the pass transistor connects the transmission line to the load when the gate signal is activated, but isolates the transmission line from the load when the gate signal is de-activated.

2. The active terminating buffer of claim 1 wherein the drive means comprises:

a pull-up transistor coupled to drive the output node high when the input node is high and the gate signal is activated;

a pull-down transistor coupled to drive the output node low when the input node is low and the gate signal is activated.

3. The active terminating buffer of claim 2 wherein the pull-up and pull-down transistors are connected directly to the output node or are directly connected to the input node and drive the output node through the pass transistor.

4. The active terminating buffer of claim 3 wherein the drive means further comprises:

a first logic gate having the input node as an input and driving a gate of the pull-up transistor;

wherein the gate signal drives a gate of the pull-down transistor;

a second logic gate having the input node as an input and outputting the gate signal;

an inverter having an input coupled to the output node and an output coupled to inputs of the first and second logic gates, whereby the drive means provides positive feedback.

5. The active terminating buffer of claim 4 wherein the first logic gate is a NAND gate and the second logic gate is a NOR gate.

6. The active terminating buffer of claim 5 wherein the pass transistor and the pull-down transistor are n-channel transistors having gates coupled to receive the gate signal; further comprising:

a p-channel pass transistor having a gate driven by the output of the first logic gate, for conducting current between the input and output nodes when input node is high but the output node is low, but otherwise isolating the output node from the input node, whereby p-channel and n-channel pass transistors are in parallel between the input and output nodes.

7. The active terminating buffer of claim 2 wherein the latch means comprises a bi-stable element on the output node, a pair of inverters in series including a first inverter having an input connected to the output node and a second inverter having an output connected to the output node, leaker transistors, or latching transistors having a gate driven by a latching inverter that has an input connected to the input node.

8. A near-zero-propagation-delay buffer comprising:

an input;

an output;

a first isolation transistor for conducting current between the input and output when a first gate signal is activated, but isolating the output from the input when the first gate signal is de-activated;

a second isolation transistor for conducting current between the input and output when a second gate signal is activated, but isolating the output from the input when the second gate signal is de-activated;

a first latch transistor for driving the output to a power-supply voltage;

a second latch transistor for driving the output to a ground voltage;

a first logic gate coupled to the input and an to an inverse of the output, for activating the first gate signal when the input is in a high logic state but the output is in a low logic state; and a second logic gate coupled to the input and to the inverse of the output, for activating the second gate signal when the input is in the low logic state but the output is in the high logic state, whereby the first isolation transistor is activated to conduct when the input is high and the output is low, but the second isolation transistor is activated to conduct when the input is low and the output is high.

9. The near-zero-propagation-delay buffer of claim 8 further comprising:

a first driver transistor having the first gate signal as a gate and having the power-supply voltage as a source; and a second driver transistor having the second gate signal as a gate and having the ground voltage as a source.

10. The near-zero-propagation-delay buffer of claim 9 wherein the first and second driver transistors have drains connected to the output and conduct current to the output.

11. The near-zero-propagation-delay buffer of claim 9 wherein the first and second driver transistors have drains connected to the input and conduct current to the input.

12. The near-zero-propagation-delay buffer of claim 9 wherein the first and second latch transistors have gates driven by a latching inverter that is inputted from the input or from the output.

13. The near-zero-propagation-delay buffer of claim 12 wherein the first logic gate is a NAND gate and the second logic gate is a NOR gate.

14. The near-zero-propagation-delay buffer of claim 13 further comprising:

an enable NOR gate coupled to an inverse enable signal and the output, for driving an enabled inverse of the output to the first logic gate;

an enable NAND gate coupled to an enable signal and the output, for driving an enabled inverse of the output to the second logic gate.

15. An active-terminator buffer comprising:

an input node for coupling to a receiving end of a transmission line;

an output node for coupling to a load driven by the transmission line;

a p-channel isolation transistor having a gate driven by a p-gate node, a drain coupled to the output node, and a source coupled to the input node;

an n-channel isolation transistor having a gate driven by a n-gate node, a drain coupled to the output node, and a source coupled to the input node;

a p-channel latching transistor having a drain coupled to the output node and a source coupled to a power supply;

an n-channel latching transistor having a drain coupled to the output node and a source coupled to a ground;

a first logic gate having the input node as an input and driving the p-gate node low when the input node is high but the output node is low;

a second logic gate having the input node as an input and driving the n-gate node high when the input node is low but the output node is high; and feedback from the output node to inputs of the first and second logic gates.

16. The active-terminator buffer of claim 15 further comprising:

a p-channel driver transistor having a gate coupled to the p-gate node and a source coupled to the power supply;

an n-channel driver transistor having a gate coupled to the n-gate node and a source coupled to the ground;

wherein drains of the p-channel driver transistor and the n-channel driver transistor are both coupled to the output node or are both coupled to the input node.

17. The active-terminator buffer of claim 16 wherein the p-channel and n-channel latching transistors have gates driven by a latching inverter that receives an input from the output node or from the input node.

18. The active-terminator buffer of claim 17 wherein the first logic gate is a NAND gate and the second logic gate is a NOR gate.

19. The active-terminator buffer of claim 18 wherein the feedback comprises:

an inverter having the output node as an input, and driving a second input to the first logic gate and a second input to the second logic gate.

20. The active-terminator buffer of claim 18 wherein the feedback comprises:

a first enabling gate having the output node as an input and an inverse enable signal as another input, and driving a second input to the first logic gate;

a second enabling gate having the output node as an input and an enable signal as another input, and driving a second input to the second logic gate, wherein when the enable signal is inactive, the n-channel and p-channel isolation and driver transistors remain off regardless of logic states of the input and output nodes.

21. The active-terminator buffer of claim 20 wherein the first enabling gate is a NOR gate and the second enabling gate is a NAND gate.

22. The active-terminator buffer of claim 21 wherein the enable signal is a multiplexer select signal that enables connecting the load to the transmission line;

wherein the transmission line is connected to a second load through a second set of p-channel and n-channel isolation and driver transistors that form a second active-terminator buffer.

\* \* \* \* \*